United States Patent
Fukuda et al.

(10) Patent No.: US 11,066,510 B2
(45) Date of Patent: Jul. 20, 2021

(54) EPOXY RESIN COMPOSITION, PROCESS FOR PRODUCING SAME, AND USES OF SAID COMPOSITION

(71) Applicant: SUMITOMO SEIKA CHEMICALS CO., LTD., Hyogo (JP)

(72) Inventors: Noriaki Fukuda, Kako-gun (JP); Ryota Harisaki, Kako-gun (JP); Katsumasa Yamamoto, Kako-gun (JP); Nobukatsu Nemoto, Koriyama (JP)

(73) Assignee: SUMITOMO SEIKA CHEMICALS CO., LTD., Hyogo (JP)

(*) Notice: Subject to any disclaimer, the term of this patent is extended or adjusted under 35 U.S.C. 154(b) by 0 days.

(21) Appl. No.: 16/882,016

(22) Filed: May 22, 2020

(65) Prior Publication Data

US 2020/0283566 A1    Sep. 10, 2020

Related U.S. Application Data

(62) Division of application No. 15/743,189, filed as application No. PCT/JP2016/070158 on Jul. 7, 2016, now abandoned.

(30) Foreign Application Priority Data

Jul. 10, 2015 (JP) .............. JP2015-139146
Oct. 9, 2015 (JP) .............. JP2015-201380

(51) Int. Cl.

| | |
|---|---|
| *C09J 11/06* | (2006.01) |
| *C08G 59/30* | (2006.01) |
| *C08G 59/68* | (2006.01) |
| *H01L 23/31* | (2006.01) |
| *H01L 23/29* | (2006.01) |
| *C08G 59/42* | (2006.01) |

(Continued)

(52) U.S. Cl.
CPC ....... *C08G 59/306* (2013.01); *C08G 59/4215* (2013.01); *C08G 59/4238* (2013.01); *C08G 59/4284* (2013.01); *C08G 59/686* (2013.01); *C09J 11/06* (2013.01); *C09J 163/00* (2013.01); *C09K 3/1018* (2013.01); *H01L 23/293* (2013.01); *H01L 23/31* (2013.01); *C08G 2190/00* (2013.01)

(58) Field of Classification Search
None
See application file for complete search history.

(56) References Cited

U.S. PATENT DOCUMENTS

| | | |
|---|---|---|
| 3,445,483 A | 5/1969 | Chaffee |
| 4,801,645 A | 1/1989 | Nishio et al. |
| 5,639,413 A | 6/1997 | Crivello |

(Continued)

FOREIGN PATENT DOCUMENTS

| | | |
|---|---|---|
| EP | 1 679 328 A1 | 7/2006 |
| GB | 1123960 A | 8/1968 |

(Continued)

OTHER PUBLICATIONS

Communication dated Jun. 23, 2020 by the European Patent Office in application No. 18738684.2.

(Continued)

*Primary Examiner* — Robert S Loewe
(74) *Attorney, Agent, or Firm* — Sughrue Mion, PLLC

(57) ABSTRACT

The present invention provides an epoxy resin composition that can produce a cured product maintaining good dielectric characteristics (low dielectric constant and low dielectric loss tangent), and having high adhesion strength to metal; and also provides a process for producing the same, a cured product obtained by curing the epoxy resin composition, and use thereof. The present invention includes an epoxy resin composition comprising an epoxy resin, an acid anhydride-based curing agent, and a curing accelerator, the epoxy resin being represented by the formula (1):

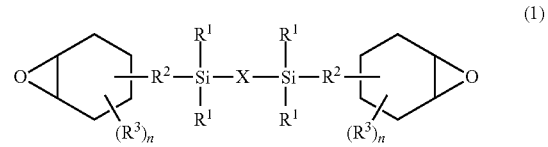

wherein X is a divalent group obtained by removing two hydrogen atoms from a hydrocarbon ring, or a divalent group represented by the formula (2):

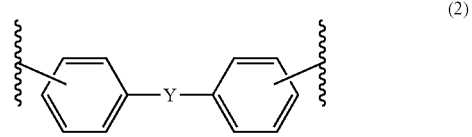

wherein Y is a bond, a $C_{1-6}$ alkylene group, etc.;
$R^1$ is the same or different, and is a $C_{1-18}$ alkyl group, etc.,
$R^2$ is the same or different, and is a $C_{1-18}$ alkylene group, etc.,
$R^3$ is the same or different, and is a $C_{1-18}$ alkyl group, etc., and
n is the same or different, and is an integer of 0 to 3. The present invention also includes a process for producing the same, a cured product of the epoxy resin composition, and use thereof.

8 Claims, No Drawings

(51) Int. Cl.
*C09J 163/00* (2006.01)
*C09K 3/10* (2006.01)

(56) References Cited

U.S. PATENT DOCUMENTS

| | | | |
|---|---|---|---|
| 5,863,970 | A | 1/1999 | Ghoshal et al. |
| 6,194,490 | B1 | 2/2001 | Roth et al. |
| 6,779,656 | B2 | 8/2004 | Klettke |
| 6,908,953 | B2 | 6/2005 | Weinmann et al. |
| 7,235,602 | B2 | 6/2007 | Klettke et al. |
| 7,368,524 | B2 | 5/2008 | Eckert et al. |
| 7,740,482 | B2 | 6/2010 | Frances et al. |
| 7,799,846 | B2 | 9/2010 | Eckert et al. |
| 7,893,130 | B2 | 2/2011 | Frances |
| 8,715,905 | B2 | 5/2014 | Tagami et al. |
| 2003/0035899 | A1 | 2/2003 | Klettke et al. |
| 2004/0122186 | A1 | 6/2004 | Herr et al. |
| 2004/0186202 | A1 | 9/2004 | Klettke et al. |
| 2008/0071035 | A1 | 3/2008 | Delsman et al. |
| 2010/0035003 | A1 | 2/2010 | Frances et al. |
| 2010/0273937 | A1 | 10/2010 | Tajima et al. |
| 2011/0076465 | A1 | 3/2011 | Takeda et al. |
| 2011/0120761 | A1 | 5/2011 | Kawai |
| 2011/0311788 | A1 | 12/2011 | Tagami et al. |
| 2013/0320264 | A1 | 12/2013 | Yoshida et al. |
| 2015/0034980 | A1* | 2/2015 | Windisch ............ H01L 27/15 257/89 |
| 2015/0368397 | A1 | 12/2015 | Suwa et al. |
| 2016/0237202 | A1 | 8/2016 | Shiobara et al. |
| 2016/0255718 | A1 | 9/2016 | Xin et al. |
| 2016/0355711 | A1 | 12/2016 | Okamoto et al. |
| 2016/0357105 | A1 | 12/2016 | Asai et al. |
| 2018/0327595 | A1 | 11/2018 | Fukuda et al. |
| 2018/0334594 | A1 | 11/2018 | Nishijima et al. |
| 2019/0070837 | A1 | 3/2019 | Ichioka et al. |

FOREIGN PATENT DOCUMENTS

| | | | |
|---|---|---|---|
| JP | 5-020447 B2 | 3/1993 | |
| JP | 6-192393 A | 7/1994 | |
| JP | 7-157540 A | 6/1995 | |
| JP | 8-325355 A | 12/1996 | |
| JP | 9-48839 A | 2/1997 | |
| JP | 10-335768 A | 12/1998 | |
| JP | 2001-240654 A | 9/2001 | |
| JP | 2003-002953 A | 1/2003 | |
| JP | 2003-519705 A | 6/2003 | |
| JP | 2003-321482 A | 11/2003 | |
| JP | 2004-231728 A | 8/2004 | |
| JP | 2004-527602 A | 9/2004 | |
| JP | 2004-277460 A | 10/2004 | |
| JP | 2005-187800 A | 7/2005 | |
| JP | 2005-272492 A | 10/2005 | |
| JP | 2006-176762 A | 7/2006 | |
| JP | 2007-254709 A | 10/2007 | |
| JP | 2008-505945 A | 2/2008 | |
| JP | 2008-506697 A | 3/2008 | |
| JP | 2009-227992 A | 10/2009 | |
| JP | 2009-544785 A | 12/2009 | |
| JP | 2010-215858 A | 9/2010 | |
| JP | 2010-254814 A | 11/2010 | |
| JP | 2011-94115 A | 5/2011 | |
| JP | 2012-1668 A | 1/2012 | |
| JP | 4849654 B2 | 1/2012 | |
| JP | 2012-162585 A | 8/2012 | |
| JP | 2013-166941 A | 8/2013 | |
| JP | 2014-177530 A | 9/2014 | |
| JP | 2016-069548 A | 5/2016 | |
| JP | 2016-079354 A | 5/2016 | |
| JP | 2016-117904 A | 6/2016 | |
| JP | 2017-003707 A | 1/2017 | |
| JP | 2017-019983 A | 1/2017 | |
| JP | 2019-48906 A | 3/2019 | |
| WO | 2006/005369 A1 | 1/2006 | |
| WO | 2006/019797 A1 | 2/2006 | |
| WO | 2012/042796 A1 | 4/2012 | |
| WO | 2012/111765 A1 | 8/2012 | |
| WO | 2013/140601 A1 | 9/2013 | |
| WO | 2014/046095 A1 | 3/2014 | |
| WO | 2014/147903 A1 | 9/2014 | |
| WO | 2015/041325 A1 | 3/2015 | |
| WO | 2015/093281 A1 | 6/2015 | |
| WO | 2017/010401 A1 | 1/2017 | |
| WO | 2017/086368 A1 | 5/2017 | |
| WO | 2018/131563 A1 | 7/2018 | |
| WO | 2018/131564 A1 | 7/2018 | |
| WO | 2018/131567 A1 | 7/2018 | |
| WO | 2018/131569 A1 | 7/2018 | |
| WO | 2018/131570 A1 | 7/2018 | |
| WO | 2018/131571 A1 | 7/2018 | |
| WO | 2018/181719 A1 | 10/2018 | |
| WO | 2019/026822 A1 | 2/2019 | |

OTHER PUBLICATIONS

Communication dated Jun. 9, 2020 by the European Patent Office in application No. 18738880.6.
Extended European Search Report dated Jan. 24, 2019 for EP Patent Application No. 16824381.4.
International Search Report for PCT/JP2016/070158 dated Sep. 20, 2016 [PCT/ISA/210].
International Search Report of PCT/JP2016/084031 dated Jan. 31, 2017 [PCT/ISA/210].
International Search Report for PCT/JP2018/000202 dated Apr. 17, 2018 [PCT/ISA/210] corresponding to U.S. Appl. No. 16/476,695.
Xin Yang et al., "Synthesis and Properties of Silphenylene-containing Epoxy Resins with High UV-stability", Journal of Macromolecular Science, Part A: Pure and Applied Chemistry, 2011, vol. 48, No. 9, pp. 692-700, 10 pages total.
International Search Report for PCT/JP2018/000203 dated Apr. 17, 2018 [PCT/ISA/210] corresponding to U.S. Appl. No. 16/476,681.
Tomikazu Ueno, "Elastomer modification of epoxy resin" (modification effect of particulate crosslinked elastomer), 23rd Open Technical Lecture, Japan Society of Epoxy Resin Technology, 1999, pp. 79-88.
International Search Report for PCT/JP2018/000200 dated Apr. 17, 2018 [PCT/ISA/210] corresponding to U.S. Appl. No. 16/476,679.
International Search Report for PCT/JP2018/000192 dated Apr. 17, 2018 [PCT/ISA/210] corresponding to U.S. Appl. No. 16/476,721.
International Search Report for PCT/JP2018/013257 dated Jun. 26, 2018 [PCT/ISA/210].
J. V. Crivello et al., "The Synthesis and Cationic Polymerization of Multifunctional Silicon-Containing Epoxy Monomers and Oligomers", Journal of Polymer Science, Part A: Polymer Chemistry, 1994, vol. 32, No. 4, pp. 683-697, 15 pages total.
Office Action dated Mar. 21, 2019, issued by the U.S. Patent and Trademark Office in U.S. Appl. No. 15/776,501.
Yang et al. "Synthesis and Properties of Silphenylene-containing Epoxy Resins with High UV-stability" Journal of Macromolecular Science, Part A: Pure adn Applied Chemistry 2011, 48, 692-700 (Year: 2011).
International Search Report for PCT/JP2018/000198 dated Apr. 17, 2018 [PCT/ISA/210] corresponding to U.S. Appl. No. 16/476,714.
Non-Final Office Action dated Sep. 16, 2020 issued in U.S. Appl. No. 16/476,714.
Office Action dated Feb. 5, 2021 issued by the USPTO in U.S. Appl. No. 16/476,721.
Non-Final Office Action dated Jan. 1, 2021 issued in U.S. Appl. No. 16/476,681.
Office Action dated Apr. 2, 2021 from the U.S. Patent & Trademark Office in U.S. Appl. No. 16/476,679.
"Poly (2, 6-dimethyl-1,4-phenylene oxide) analytical Standard", Website Sigma Aldrich, PPE, article 181803.
Office Action dated May 7, 2021 issued by the European Patent Office in EP patent application No. 18738683.4.

* cited by examiner

EPOXY RESIN COMPOSITION, PROCESS FOR PRODUCING SAME, AND USES OF SAID COMPOSITION

CROSS REFERENCE TO RELATED APPLICATIONS

This application is a Divisional Application of U.S. application Ser. No. 15/743,189, filed Jan. 9, 2018, which is a National Stage of International Application No. PCT/JP2016/070158, filed on Jul. 7, 2016, which claims priority from Japanese Patent Application No. 2015-139146 filed on Jul. 10, 2015, and Japanese Patent Application No. 2015-201380 filed on Oct. 9, 2015, the contents of all of which are incorporated herein by reference in their entirety.

TECHNICAL FIELD

The present invention relates to an epoxy resin composition, a process for producing the same, and use of the composition.

BACKGROUND ART

Epoxy resins, which are a type of thermosetting resin, are used in various fields, such as electric and electronic materials, coating compositions, adhesives, and composite materials, because cured products thereof have excellent heat resistance, electrical insulating properties, and like characteristics. Particularly in the field of electric and electronic materials, epoxy resins are used in semiconductor sealing materials, printed circuit board materials, etc.

The frequency of transmission signals has recently increased along with an increase in the performance of electronic devices and a reduction in the weight and size thereof. In accordance with the increased frequency, materials used in printed circuit boards and semiconductor sealing materials are strongly required to have a lower dielectric constant in the high frequency region.

Epoxy resins satisfy performance requirements for electrical insulating properties and heat resistance; however, highly polar hydroxyl groups are generated due to the reaction between epoxy group and active hydrogen, thereby increasing relative dielectric constant. Thus, satisfactory dielectric characteristics (low dielectric constant, etc.) are not obtained.

Accordingly, for the purpose of improving the dielectric characteristics (achieving low dielectric constant and low dielectric loss tangent) of epoxy resins, resin compositions comprising an epoxy resin in combination with a phenol novolak resin or the like are reported (PTL 1 to PTL 5, etc.).

Moreover, in copper wiring used in substrate materials, the development of low-roughness copper foil and copper plating corresponding to the increased frequency of transmission signals has been advanced. However, if the surface roughness of copper wiring is low, the anchor effect of copper and epoxy resin is reduced, thereby making it difficult to ensure adhesion strength. For this reason, there is a demand for epoxy resins having sufficient adhesion to copper wiring that has low surface roughness and a small anchor effect.

PTL 6 reports a photocurable composition comprising a silicon-containing epoxy resin. Further, PTL 7 reports that a cured product is obtained using a silicon-containing epoxy resin and a curing agent.

CITATION LIST

Patent Literature

PTL 1: JP1995-157540A
PTL 2: JP2005-187800A
PTL 3: JP2009-227992A
PTL 4: JPH06-192393A
PTL 5: JPH08-325355A
PTL 6: JP2012-001668A
PTL 7: GB123960

SUMMARY OF INVENTION

Technical Problem

In the compositions of PTL 1 to PTL 5, the content ratio of epoxy resin is reduced by using the epoxy resin in combination with other components, such as a phenol novolak resin, thereby improving the dielectric characteristics (achieving low dielectric constant and low dielectric loss tangent) of cured products of these compositions. However, there was a problem such that sufficient adhesion strength to metal, such as copper and aluminum, was not achieved.

Accordingly, an object of the present invention is to provide an epoxy resin composition that can produce a cured product maintaining good dielectric characteristics (low dielectric constant and low dielectric loss tangent), and having high adhesion strength to metal; and to also provide a process for producing the same.

Another object of the present invention is to provide a cured product obtained by curing the epoxy resin composition, and use thereof (e.g., as a semiconductor sealing material, a printed circuit board material, a composite material, etc.).

Solution to Problem

As a result of extensive research to solve the above problem, the present inventor found that the above problem can be solved by an epoxy resin composition comprising a specific epoxy resin, an acid anhydride-based curing agent, and a curing accelerator, the epoxy resin containing a silicon atom having an alicyclic epoxy group. The present invention has been completed upon further studies based on this finding.

The present invention includes an epoxy resin composition comprising a specific epoxy resin, an acid anhydride-based curing agent, and a curing accelerator, as well as a process for producing the same, and use thereof described below.

Item 1. An epoxy resin composition comprising an epoxy resin, an acid anhydride-based curing agent, and a curing accelerator, the epoxy resin being represented by the formula (1):

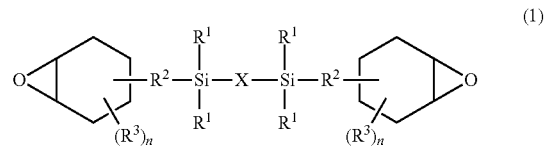

wherein X is a divalent group obtained by removing two hydrogen atoms from a hydrocarbon ring, or a divalent group represented by the formula (2):

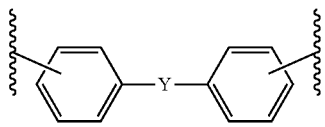

(2)

wherein Y is a bond, a $C_{1-6}$ alkylene group, an oxygen atom (—O—), or a group represented by the formula: —S(O)$_m$— wherein m is 0, 1, or 2;

$R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

$R^2$ is the same or different, and is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom; and n is the same or different, and is an integer of 0 to 3.

Item 2. The epoxy resin composition according to claim 1, wherein the curing accelerator is a nitrogen-containing curing accelerator.

Item 3. The epoxy resin composition according to Item 2, wherein the nitrogen-containing curing accelerator is a tertiary amine compound or an imidazole compound.

Item 4. The epoxy resin composition according to Item 2 or 3, wherein the nitrogen-containing curing accelerator is an imidazole compound.

Item 5. The epoxy resin composition according to Item 2 or 3, wherein the nitrogen-containing curing accelerator is a tertiary amine compound.

Item 6. A process for producing the epoxy resin composition according to Item 1, the process comprising mixing an epoxy resin represented by the formula (1), an acid anhydride-based curing agent, and a curing accelerator.

Item 7. A cured product of the epoxy resin composition according to any one of Items 1 to 5.

Item 8. A semiconductor sealing material, a liquid sealing material, a potting material, a sealing material, a printed circuit board material, or a composite material, each of which uses the epoxy resin composition according to any one of Items 1 to 5 or a cured product thereof (the cured product of the epoxy resin composition according to Item 7).

Item 9. The epoxy resin composition according to any one of Items 1 to 5 for use in a semiconductor sealing material, a liquid sealing material, a potting material, a sealing material, a printed circuit board material, or a composite material.

Item 10. Use of the epoxy resin composition according to any one of Items 1 to 5 for producing a semiconductor sealing material, a liquid sealing material, a potting material, a sealing material, a printed circuit board material, or a composite material.

Advantageous Effects of Invention

The epoxy resin composition of the present invention can produce a cured product maintaining good dielectric characteristics (low dielectric constant and low dielectric loss tangent) and having high adhesion strength to metal. Therefore, the epoxy resin composition of the present invention can be suitably used for applications, such as semiconductor sealing material, liquid sealing materials, potting materials, sealing materials, printed circuit board materials, and composite materials.

DESCRIPTION OF EMBODIMENTS

In the present specification, the phrase '"containing" or "comprising" a component' means that the component is contained, and that any other components may also be contained. In addition, this phrase includes the concept of "consisting of," which means that only the component is contained, as well as the concept of "consisting essentially of," which means that the component is essentially contained.

The present invention is described in detail below.

The epoxy resin composition of the present invention characteristically comprises an epoxy resin represented by the formula (1), an acid anhydride-based curing agent, and a curing accelerator.

The epoxy resin used in the present invention has a structure represented by the formula (1). In the formula (1), $R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom. The one or more carbon atoms is preferably a carbon atom that is not directly bonded to the silicon atom. The one or more carbon atoms that may be replaced may be one or plural (e.g., 2, 3, 4, 5, or 6) carbon atoms, and preferably one carbon atom. In terms of ease of synthesis, etc., it is preferable that $R^1$ bonded to the same silicon atom be the same, and it is more preferable that all $R^1$ be the same.

The $C_{1-18}$ alkyl group represented by $R^1$ is, for example, a linear or branched alkyl group. Examples include a methyl group, an ethyl group, an n-propyl group, an isopropyl group, an n-butyl group, an isobutyl group, a tert-butyl group, an n-pentyl group, a neopentyl group, a tert-pentyl group, an n-hexyl group, an n-heptyl group, a 2,2,4-trimethylpentyl group, an n-octyl group, an isooctyl group, an n-nonyl group, an n-decyl group, an n-dodecyl group, and the like. Preferable is a $C_{1-10}$ alkyl group, more preferable is a $C_{1-6}$ alkyl group, even more preferable is a $C_{1-3}$ alkyl group, and particularly preferable is a methyl group.

The $C_{2-9}$ alkenyl group represented by $R^1$ is, for example, a linear or branched alkenyl group. Examples include a vinyl group, an allyl group, a 2-propenyl group, a butenyl group, a pentenyl group, a hexenyl group, a heptenyl group, an octenyl group, a nonenyl group, and the like. Preferable is a $C_{2-4}$ alkenyl group.

The cycloalkyl group represented by $R^1$ is, for example, a 3- to 8-membered-ring cycloalkyl group. Examples include a cyclopentyl group, a cyclohexyl group, a cycloheptyl group, a methylcyclohexyl group, and the like.

The aryl group represented by $R^1$ is, for example, a monocyclic or bicyclic aryl group. Examples include a phenyl group, a tolyl group, a xylyl group, an ethyl phenyl group, a naphthyl group, and the like. Preferable among them is a phenyl group.

The aralkyl group represented by $R^1$ is, for example, a $C_{1-4}$ alkyl group substituted with an aryl group (particularly a phenyl group). Examples include a benzyl group, an α-phenethyl group, a β-phenethyl group, a β-methylphenethyl group, and the like.

R¹ is preferably a $C_{1-3}$ alkyl group, and more preferably a methyl group.

In the formula (1), $R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom. The one or more carbon atoms that may be replaced may be one or plural (e.g., 2, 3, 4, 5, or 6) carbon atoms, and preferably one carbon atom. When $R^3$ is directly bonded to the oxirane ring, the one or more carbon atoms is preferably a carbon atom that is not directly bonded to the oxirane ring.

Examples of the $C_{1-18}$ alkyl group, $C_{2-9}$ alkenyl group, cycloalkyl group, aryl group, and aralkyl group represented by $R^3$ include the same corresponding substituents represented by $R^1$ described above.

$R^3$ is preferably a $C_{1-3}$ alkyl group, and more preferably a methyl group.

In the formula (1), n is the same or different, and is an integer of 0 to 3 (0, 1, 2, or 3). n is preferably 0 or 1, and more preferably 0. n represents the number of $R^3$ bonded to one alicyclic epoxy group contained in the formula (1).

The formula (1) includes two alicyclic epoxy groups bonded to $R^2$ and represented by:

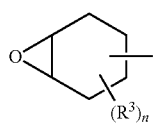

When $R^3$ bonded to one of the alicyclic epoxy groups is regarded as $R^{3a}$, whereas $R^3$ bonded to the other alicyclic epoxy group is regarded as $R^{3b}$, that is, when the formula (1) is the following formula (1'):

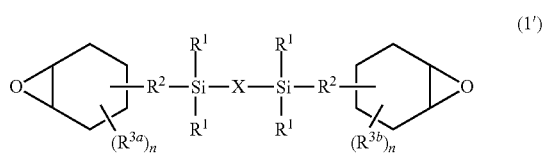

(1')

wherein $R^1$, $R^2$, X, and n are as defined in the formula (1), each of $R^{3a}$ may be the same or different, each of $R^{3b}$ may also be the same or different, and $R^{3a}$ and $R^{3b}$ may be the same or different. In this case, n of $(R^{3a})_n$ and n of $(R^{3b})_n$ may also be the same or different. The formula (1) also includes the embodiment of the formula (1').

The alicyclic epoxy group is preferably:

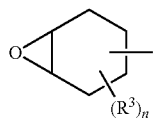

In this group, it is particularly preferable that n be 1 or 0. The alicyclic epoxy group is particularly preferably:

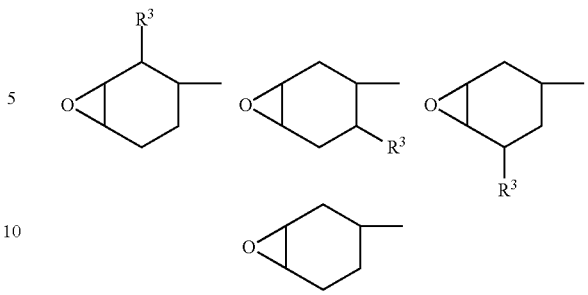

It is even more preferable that n be 0.

In the formula (1), $R^2$ is the same or different, and is a $C_{1-18}$ alkylene group, or a linear or branched alkylene group. Examples include a methylene group, a methylmethylene group, an ethylmethylene group, a dimethylmethylene group, a diethylmethylene group, a dimethylene group (—$CH_2CH_2$—), a trimethylene group (—$CH_2CH_2CH_2$—), a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, and the like. Preferable is a $C_{2-10}$ alkylene group, more preferable is a $C_{2-4}$ alkylene group, even more preferable is a $C_2$ or $C_3$ alkylene group (particularly a dimethylene group or a trimethylene group), and particularly preferable is a $C_2$ alkylene group (particularly a dimethylene group).

In the $C_{1-18}$ alkylene group, one or more carbon atoms other than the carbon atom directly bonded to the silicon atom may be replaced by at least one atom selected from the group consisting of an oxygen atom and a nitrogen atom. When $R^2$ is directly bonded to the oxirane ring, the one or more carbon atoms is preferably a carbon atom that is not directly bonded to the oxirane ring.

It is preferable that $R^2$ and $R^3$ be bonded to different carbon atoms in the alicyclic epoxy group.

In the formula (1), the "hydrocarbon ring" of the divalent group represented by X obtained by removing two hydrogen atoms from a hydrocarbon ring is a monocyclic or polycyclic (particularly bicyclic or tricyclic) aliphatic hydrocarbon ring, or a monocyclic or polycyclic aromatic hydrocarbon ring. Examples include a cyclopentane ring, a cyclohexane ring, a tetralin ring, a decahydronaphthalene ring, a 1,2,3,4,5,6,7,8-octahydronaphthalene ring, a norbornene ring, an adamantane ring, a benzene ring, a toluene ring, a xylene ring, a naphthalene ring, a phenanthrene ring, an anthracene ring, a pyrene ring, a triphenylene ring, and the like. Preferable are a cyclohexane ring and a benzene ring. The divalent group represented by X is preferably a cyclohexane-1,4-diyl group or a 1,4-phenylene group; and more preferably a 1,4-phenylene group.

In the formula (2), the $C_{1-6}$ alkylene group represented by Y is, for example, a chain or branched alkylene group. Examples include a methylene group, a methylmethylene group, an ethylmethylene group, a dimethylmethylene group, a diethylmethylene group, a dimethylene group (—$CH_2CH_2$—), a trimethylene group (—$CH_2CH_2CH_2$—), and the like.

In the formula (2), m is 0, 1, or 2; and preferably 0 or 2.

Y is preferably a bond, an oxygen atom, a methylene group, a dimethylmethylene group, —S—, or —$SO_2$—; and more preferably a bond, a dimethylmethylene group, an oxygen atom, or —$SO_2$—.

Preferable among the divalent groups represented by the formula (2) is a group represented by the formula (2a):

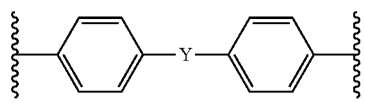

wherein Y is as defined above.

In the formula (2a), Y is preferably a bond, a dimethylmethylene group, an oxygen atom, or —SO$_2$—.

Preferable among the epoxy resins represented by the formula (1) is a compound represented by the formula (1a):

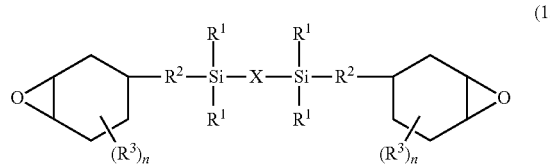

wherein each symbol is as defined above.

It is preferable that in the formula (1a), all $R^1$ are $C_{1-3}$ alkyl groups (particularly methyl groups), both n are 0, both $R^2$ are dimethylene groups, and X is a 1,4-phenylene group.

The epoxy resin represented by the formula (1) (including the epoxy resins represented by the formulas (1') and (1a)) can be produced by a known method, for example, based on or according to the disclosures of PTL 6 and PTL 7. As a specific example, the epoxy resin can be produced by the following reaction formula.

Reaction formula

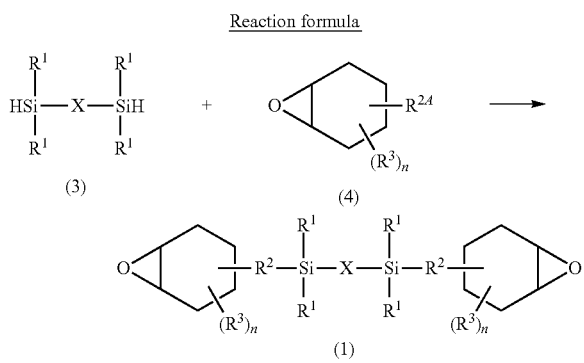

wherein $R^{2A}$ is a $C_{1-18}$ alkylidene group or a $C_{2-18}$ alkenyl group, and other symbols are as defined above.

The $C_{1-18}$ alkylidene group represented by $R^{2A}$ is, for example, a linear or branched alkylidene group. Examples include a methylidene group, a propylidene group, an isopropylidene group, a butylidene group, an isobutylidene group, a sec-butylidene group, a pentylidene group, an isopentylidene group, an octylidene group, an isooctylidene group, and the like. Preferable is a $C_{1-10}$ alkylidene group, more preferable is a $C_{1-4}$ alkylidene group, even more preferable is a $C_{1-3}$ alkylidene group, and particularly preferable is a methylidene group or an ethylidene group.

The $C_{2-18}$ alkenyl group represented by $R^{2A}$ is, for example, a linear or branched alkenyl group. Examples include a vinyl group, an allyl group, a propenyl group, a butenyl group, a pentenyl group, a hexenyl group, a heptenyl group, an octenyl group, a norbornenyl group, a cyclohexenyl group, and the like. Preferable is a $C_{2-10}$ alkenyl group, more preferable is a $C_{2-4}$ alkenyl group, even more preferable is a $C_2$ or $C_3$ alkenyl group, and particularly preferable is a vinyl group or an allyl group.

The epoxy resin can be produced by hydrosilylation of the compound represented by the formula (3) and the compound represented by the formula (4). Hydrosilylation can be generally performed in the presence of a catalyst in the presence or absence of a solvent.

The catalyst used in hydrosilylation may be a known catalyst. Examples include platinum-based catalysts, such as platinum carbon, chloroplatinic acid, olefin complexes of platinum, alkenylsiloxane complexes of platinum, and carbonyl complexes of platinum; rhodium-based catalysts, such as tris(triphenylphosphine)rhodium; and iridium-based catalysts, such as bis(cyclooctadienyl)dichloroiridium. These catalysts may be in the form of solvates (e.g., hydrates, alcoholates, etc.). Further, the catalyst may be used in the form of a solution obtained by dissolving the catalyst in an alcohol (e.g., ethanol) when used.

The amount of the catalyst used may be an effective amount as the catalyst, and is not particularly limited. The amount of the catalyst used is generally 0.00001 to 20 parts by mass, and preferably 0.0005 to 5 parts by mass, based on the total amount of 100 parts by mass of the compound represented the formula (3) and the compound represented by the formula (4).

Although hydrosilylation proceeds without use of a solvent, the reaction can be carried out under milder conditions by using a solvent. Examples of solvents include aromatic hydrocarbon solvents, such as toluene and xylene; aliphatic hydrocarbon solvents, such as hexane and octane; ether solvents, such as tetrahydrofuran and dioxane; alcohol solvents, such as ethanol and isopropanol; and the like. These may be used singly or in combination of two or more.

The amount of the compound represented by the formula (4) is generally 0.5 to 2 mol, preferably 0.6 to 1.5 mol, and more preferably 0.8 to 1.2 mol, per mol of the Si—H group in the compound represented by the formula (3).

The reaction temperature is 20° C. to 150° C., and preferably 50° C. to 120° C. The reaction time is about 1 hour to 24 hours.

After completion of the reaction, for example, the solvent is distilled off from the reaction mixture, thereby obtaining an epoxy resin represented by the formula (1).

The epoxy resin composition of the present invention may contain an epoxy resin other than the epoxy resin represented by the formula (1) within a range in which the effects of the present invention can be exhibited. Examples include bisphenol A epoxy resins, bisphenol F epoxy resins, phenol novolak epoxy resins, cresol novolak epoxy resins, cycloaliphatic epoxy resins, brominated epoxy resins, nitrogen-containing ring epoxy resins such as triglycidyl isocyanurate- and hydantoin-type epoxy resins, hydrogenated bisphenol A epoxy resins, aliphatic epoxy resins, glycidyl ether epoxy resins, bisphenol S epoxy resins, biphenyl epoxy resins, dicyclo epoxy resins, naphthalene epoxy resins, and the like. These epoxy resins may be used singly or in combination of two or more.

The acid anhydride-based curing agent used in the present invention may be a known acid anhydride-based curing agent. Examples include cyclic aliphatic acid anhydrides, aromatic acid anhydrides, aliphatic acid anhydrides, and the like. Specific examples include hexahydrophthalic anhydride, 3-methylhexahydrophthalic anhydride, 4-methylhexahydrophthalic anhydride, 1-methylnorbornane-2,3-dicarboxylic anhydride, 5-methylnorbornane-2,3-dicarboxylic anhydride, norbornane-2,3-dicarboxylic anhydride, 1-methylnadic anhydride, 5-methylnadic anhydride, nadic anhydride, phthalic anhydride, tetrahydrophthalic anhydride, 3-methyltetrahydrophthalic anhydride, 4-methyltetrahydrophthalic anhydride, dodecenylsuccinic anhydride, and the like. Preferable are cyclic aliphatic acid anhydrides, such as hexahydrophthalic anhydride, 3-methylhexahydrophthalic anhydride, and 4-methylhexahydrophthalic anhydride. These curing agents may be used singly or in combination of two or more.

The amount of acid anhydride-based curing agent used is not particularly limited; however, the amount of the active group (acid anhydride group) in the curing agent reactive with the epoxy group is preferably 0.5 to 1.5 equivalents, and more preferably 0.7 to 1.2 equivalents, per equivalent of the epoxy group in the epoxy resin composition.

The epoxy resin composition of the present invention may contain a curing agent other than the acid anhydride-based curing agent within a range in which the effects of the present invention can be exhibited. Examples include aliphatic polyamines, such as triethylenetetramine; polyaminoamide; polymercaptans; aromatic polyamines, such as diaminodiphenylmethane; phenol novolak resin; dicyandiamide; and the like.

The acid anhydride-based curing agent used in the epoxy resin composition of the present invention has a long pot life and low toxicity; however, the curing reaction may proceed relatively slowly, and curing may require a high temperature and a long period of time. Accordingly, it is preferable to use a curing accelerator in combination.

Examples of curing accelerators include tertiary amine compounds, such as benzyldimethylamine, cyclohexyldimethylamine, pyridine, triethanolamine, 2-(dimethylaminomethyl)phenol, dimethylpiperazine, 1,8-diazabicyclo[5,4,0]undec-7-ene (DBU), 1,5-diazabicyclo[4.3.0]non-5-ene (DBN), 1,4-diazabicyclo[2.2.2]octane (DABCO), and 2,4,6-tris(dimethylaminomethyl)phenol; imidazole compounds, such as 2-methylimidazole, 2-ethylimidazole, 2-n-heptylimidazole, 2-n-undecylimidazole, 2-phenylimidazole, 2-phenyl-4-methylimidazole, 1-benzyl-2-methylimidazole, 1-benzyl-2-phenylimidazole, 1,2-dimethylimidazole, 2-ethyl-4-methylimidazole, 1-(2-cyanoethyl)-2-methylimidazole, 1-(2-cyanoethyl)-2-n-undecylimidazole, 1-(2-cyanoethyl)-2-phenylimidazole, 1-(2-cyanoethyl)-2-ethyl-4-methylimidazole, 2-phenyl-4-methyl-5-hydroxymethylimidazole, 2-phenyl-4,5-di(hydroxymethyl)imidazole, 1-(2-cyanoethyl)-2-phenyl-4,5-di((2'-cyanoethoxy)methyl)imidazole, 1-(2-cyanoethyl)-2-n-undecyl imidazolium trimellitate, 1-(2-cyanoethyl)-2-phenyl imidazolium trimellitate, 1-(2-cyanoethyl)-2-ethyl-4-methyl imidazolium trimellitate, 2,4-diamino-6-(2'-methylimidazolyl-(1'))ethyl-s-triazine, 2,4-diamino-6-(2'-n-undecylimidazolyl)ethyl-s-triazine, 2,4-diamino-6-(2'-ethyl-4'-methylimidazolyl-(1'))ethyl-s-triazine, isocyanuric acid adducts of 2-methylimidazole, isocyanuric acid adducts of 2-phenylimidazole, and isocyanuric acid adducts of 2,4-diamino-6-(2'-methylimidazolyl-(1'))ethyl-s-triazine; phosphine compounds, such as triphenylphosphine; phosphonium salts, such as tetraphenyl phosphonium tetraphenyl borate; metal compounds, such as tin octylate; and the like. These may be used singly or in combination of two or more.

Among these, a curing accelerator containing a nitrogen atom is preferably used. When a nitrogen-containing curing accelerator is used, an epoxy resin composition having better metal adhesion can be obtained.

It is more preferable to use a tertiary amine compound or an imidazole compound as a curing accelerator, thereby obtaining an epoxy resin composition having good heat resistance and metal adhesion.

The amount of the nitrogen-containing curing accelerator is not particularly limited; however, the amount of the nitrogen-containing curing accelerator is preferably 0.1 to 5 parts by mass, and more preferably 0.5 to 2 parts by mass, based on 100 parts by mass of the epoxy resin in the epoxy resin composition, because an epoxy resin composition that can produce a cured product having good heat resistance and metal adhesion is obtained.

The specific epoxy resins, acid anhydride-based curing agents, and curing accelerators mentioned above can be used in any combination. Although it is not particularly limited, it is preferable to use the epoxy resin represented by the formula (1) (including the epoxy resins represented by the formulas (1') and (1a)) in combination with a cyclic aliphatic acid anhydride as an acid anhydride-based curing agent, and a tertiary amine compound or an imidazole compound as a curing accelerator (a nitrogen-containing curing accelerator). Further, it is more preferable to use the epoxy resin represented by the formula (1) in combination with at least one acid anhydride-based curing agent selected from the group consisting of hexahydrophthalic anhydride, 3-methylhexahydrophthalic anhydride, and 4-methylhexahydrophthalic anhydride, and at least one curing accelerator selected from the group consisting of 2-ethyl-4-methylimidazole, 2,4,6-tris(dimethylaminomethyl)phenol, 1,4-diazabicyclo[2.2.2]octane, and 1,8-diazabicyclo[5.4.0]undec-7-ene.

The epoxy resin composition of the present invention may optionally contain additives within a range that does not impair the objects and effects of the present invention. Examples of additives include inorganic fillers, fibrous reinforcing agents, antioxidants, inorganic fluorescent substances, lubricants, ultraviolet absorbers, heat light stabilizers, dispersants, antistatic agents, polymerization inhibitors, antifoaming agents, solvents, anti-aging agents, radical inhibitors, adhesion-improving agents, flame retardants, surfactants, storage stability-improving agents, ozone aging inhibitors, thickeners, plasticizers, radiation-blocking agents, nucleating agents, coupling agents, conductivity-imparting agents, phosphorus-based peroxide-decomposing agents, pigments, metal deactivators, physical property-controlling agents, and the like.

The epoxy resin composition of the present invention can be produced by mixing the epoxy resin represented by the formula (1), an acid anhydride-based curing agent, and a curing accelerator, and further optionally other components. The mixing method is not particularly limited, as long as it allows uniform mixing.

A cured product can be obtained by curing the epoxy resin composition of the present invention. The curing method is not particularly limited; for example, the composition can be cured by heating. Moreover, the epoxy resin composition can be dissolved in a solvent (e.g., toluene, acetone, etc.) to prepare a varnish, and then the varnish can be applied to a substrate (e.g., copper foil, aluminum foil, a polyimide film, etc.), followed by heating, thereby obtaining a film-like cured product. The curing temperature is generally room temperature to 200° C. The curing time varies depending on the composition liquid, and can be generally widely set from 30 minutes to 1 week.

A cured product obtained by curing the epoxy resin composition of the present invention has good dielectric characteristics (low dielectric constant and low dielectric loss tangent) and high adhesion strength to metal, such as copper and aluminum; therefore, for example, the cured product can be suitably used for applications, such as semiconductor sealing materials, liquid sealing materials, potting materials, sealing materials, printed circuit board materials, and composite materials. Furthermore, the present invention includes a semiconductor sealing material, a liquid sealing material, a potting material, a sealing material, a printed circuit board material, and a composite material, each of which uses the epoxy resin composition or a cured product thereof.

EXAMPLES

The present invention is described in more detail below with reference to Examples; however, the present invention is not limited to only these Examples.

Production Example 1 (Production of Epoxy Resin A)

1,2-Epoxy-4-vinylcyclohexane (25 g), 0.25 g of 2 wt % ethanol solution of hexachloroplatinic acid hexahydrate, and 250 g of toluene were placed in a 500-mL four-necked flask equipped with a stirrer, a thermometer, and a condenser in a nitrogen atmosphere. After the temperature was raised to 70° C., 20 g of 1,4-bis(dimethylsilyl)benzene was slowly added dropwise, and the mixture was then stirred at 90° C. for 4 hours. After the toluene was concentrated, 42 g of slightly yellow liquid (epoxy resin A: 1,4-di[2-(3,4-epoxycyclohexylethyl)dimethylsilyl]benzene) was obtained.

Examples 1 to 4 and Comparative Examples 1 and 2

Components in amounts (mass ratio) shown in Table 1 were uniformly mixed, and the mixture was then sufficiently degassed, thereby preparing epoxy resin compositions.
The components in Table 1 are as follows.
Epoxy resin B: Bis-A epoxy resin (JER Grade 828, produced by Mitsubishi Chemical Corporation)
Acid anhydride-based curing agent: 4-methylhexahydrophthalic anhydride/hexahydrophthalic anhydride=70/30 (RIKACID MH-700, produced by New Japan Chemical Co., Ltd.)
Curing accelerator A: 2-ethyl-4-methylimidazole (2E4MZ, produced by Mitsubishi Chemical Corporation)
Curing accelerator B: 2,4,6-tris(dimethylaminomethyl) phenol (DMP, produced by Tokyo Chemical Industry Co., Ltd.)
Curing accelerator C: 1,4-diazabicyclo[2.2.2]octane (DABCO, produced by Tokyo Chemical Industry Co., Ltd.)
Curing accelerator D: 1,8-diazabicyclo[5.4.0]undec-7-ene (DBU, produced by Tokyo Chemical Industry Co., Ltd.)

Test Example 1

(1) Tensile Shear Adhesion Strength to Aluminum
The epoxy resin compositions obtained in Examples 1 to 4 and Comparative Examples 1 and 2 were each applied to an aluminum plate (JIS A1050P) (size: 2×25×100 mm) so that the adhesive part had a rectangular shape (12.5×25 mm). Then, another aluminum plate was bonded thereto, and cured by heating at 100° C. for 1 hour, 120° C. for 2 hours, and 150° C. for 2 hours. Thus, tensile shear adhesion test pieces were obtained.
The obtained adhesion test pieces were each subjected to a tensile shear adhesion test using a tensile tester (AGS-X, produced by Shimadzu Corp.) with a clamp distance of 100 mm at a test rate of 5 mm/min, and the tensile shear adhesion strength was calculated from the measured maximum breaking strength and the adhesion area. Table 1 shows the results.
(2) Maintenance Rate of Tensile Shear Adhesion Strength to Aluminum After High-Temperature High-Humidity Test
The epoxy resin compositions obtained in Examples 1 to 4 and Comparative Examples 1 and 2 were each applied to an aluminum plate (JIS A1050P) (size: 2×25×100 mm) so that the adhesive part had a rectangular shape (12.5×25 mm). Then, another aluminum plate was bonded thereto, and cured by heating at 100° C. for 1 hour, 120° C. for 2 hours, and 150° C. for 2 hours. Thus, tensile shear adhesion test pieces were obtained.
The obtained adhesion test pieces were allowed to stand in an atmosphere at 85° C. with 85% RH for 168 hours. Subsequently, the test pieces were each subjected to a tensile shear adhesion test using a tensile tester (AGS-X, produced by Shimadzu Corp.) with a clamp distance of 100 mm at a test rate of 5 mm/min, and the tensile shear adhesion strength was calculated from the measured maximum breaking strength and the adhesion area.
The maintenance rate (%) of tensile shear adhesion strength to aluminum after the high-temperature high-humidity test was calculated by dividing the tensile shear adhesion strength to aluminum after the high-temperature high-humidity test by the tensile shear adhesion strength to aluminum before the high-temperature high-humidity test. Table 1 shows the results.
(3) Tensile Shear Adhesion Strength to Copper
The epoxy resin compositions obtained in Examples 1 to 4 and Comparative Examples 1 and 2 were each applied to an oxygen-free copper plate (JIS C1020P) (size: 2×25×100 mm) so that the adhesive part had a rectangular shape (12.5×25 mm). Then, another oxygen-free copper plate was bonded thereto, and cured by heating at 100° C. for 1 hour, 120° C. for 2 hours, and 150° C. for 2 hours. Thus, tensile shear adhesion test pieces were obtained.
The obtained adhesion test pieces were each subjected to a tensile shear adhesion test using a tensile tester (AGS-X, produced by Shimadzu Corp.) with a clamp distance of 100 mm at a test rate of 5 mm/min, and the tensile shear adhesion strength was calculated from the measured maximum breaking strength and the adhesion area. Table 1 shows the results.
(4) Maintenance Rate of Tensile Shear Adhesion Strength to Copper After High-Temperature High-Humidity Test
The epoxy resin compositions obtained in Examples 1 to 4 and Comparative Examples 1 and 2 were each applied to an oxygen-free copper plate (JIS C1020P) (size: 2×25×100 mm) so that the adhesive part had a rectangular shape (12.5×25 mm). Then, another oxygen-free copper plate was bonded thereto, and cured by heating at 100° C. for 1 hour, 120° C. for 2 hours, and 150° C. for 2 hours. Thus, tensile shear adhesion test pieces were obtained.
The obtained adhesion test pieces were allowed to stand in an atmosphere at 85° C. with 85% RH for 168 hours. Subsequently, the test pieces were each subjected to a tensile shear adhesion test using a tensile tester (AGS-X, produced by Shimadzu Corp.) with a clamp distance of 100 mm at a test rate of 5 mm/min, and the tensile shear adhesion strength was calculated from the measured maximum breaking strength and the adhesion area.

The maintenance rate (%) of tensile shear adhesion strength to copper after the high-temperature high-humidity test was calculated by dividing the tensile shear adhesion strength to copper after the high-temperature high-humidity test by the tensile shear adhesion strength to copper before the high-temperature high-humidity test. Table 1 shows the results.

(5) Electric Characteristics (Dielectric Characteristics)

The epoxy resin compositions obtained in Examples 1 to 4 and Comparative Examples 1 and 2 were each poured into a resin mold (thickness: 2 mm), and cured by heating at 100° C. for 1 hour, 120° C. for 2 hours, and 150° C. for 2 hours. Thus, test pieces for dielectric measurement were obtained.

The obtained test pieces were each calibrated with PTFE using a dielectric constant measuring device (Impedance Analyzer, produced by Agilent), and then the relative dielectric constant (1 GHz) and the dielectric loss tangent (1 GHz) were measured. Table 1 shows the results.

(6) Glass Transition Temperature

The epoxy resin compositions obtained in Examples 1 to 4 and Comparative Examples 1 and 2 were each poured into a resin mold, and cured by heating at 100° C. for 1 hour, 120° C. for 2 hours, and 150° C. for 2 hours. Thus, test pieces for glass transition temperature measurement were obtained.

The glass transition temperature of the obtained test pieces was measured using a thermomechanical analyzer (SSC5200, produced by SII Nanotechnology Inc.) in compressed mode at a load of 50 mN at 5° C./min. Table 1 shows the results.

(7) Changes in Test Pieces After Heat Resistance Test

The epoxy resin compositions obtained in Examples 1 to 4 and Comparative Examples 1 and 2 were each poured into a resin mold, and cured by heating at 100° C. for 1 hour, 120° C. for 2 hours, and 150° C. for 2 hours. After the glass transition temperature of the cured test pieces was measured, the test pieces after measurement were observed, and the presence of cracks was evaluated based on their appearance.

The epoxy resin compositions obtained in Examples 1 to 4 have high adhesion strength to metal. In particular, even after the high-temperature high-humidity test, they can maintain high adhesion strength and have adhesion reliability. Furthermore, they have good dielectric characteristics and heat resistance.

In contrast, the epoxy resin compositions obtained in Comparative Examples 1 and 2 have a certain degree of initial adhesion strength to metal; however, their adhesion was rapidly reduced after the high-temperature high-humidity test. In addition, it was confirmed that their dielectric characteristics and heat resistance were inferior to those of the epoxy resin compositions obtained in Examples 1 to 4.

The invention claimed is:

1. A method of improving adhesion strength of a cured product of an epoxy resin composition to metal, the method comprising:

(1) mixing an epoxy resin, an acid anhydride-based curing agent, and a curing accelerator, (2) applying the mixture of step (1) on a metal, and (3) curing the mixture of step (1) on the metal, wherein the epoxy resin is represented by the formula (1):

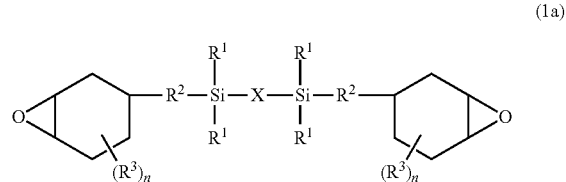

wherein X is a divalent group obtained by removing two hydrogen atoms from a hydrocarbon ring, or a divalent group represented by the formula (2):

TABLE 1

|  | Example 1 | Example 2 | Example 3 | Example 4 | Comparative Example 1 | Comparative Example 2 |
|---|---|---|---|---|---|---|
| Epoxy resin A | 100 | 100 | 100 | 100 | 0 | 0 |
| Epoxy resin B | 0 | 0 | 0 | 0 | 100 | 100 |
| Acid anhydride-based curing agent | 76 | 76 | 76 | 76 | 88 | 88 |
| Curing accelerator A | 1 | 0 | 0 | 0 | 1 | 0 |
| Curing accelerator B | 0 | 1 | 0 | 0 | 0 | 0 |
| Curing accelerator C | 0 | 0 | 1 | 0 | 0 | 0 |
| Curing accelerator D | 0 | 0 | 0 | 1 | 0 | 1 |
| Tensile shear adhesion strength (MPa) to aluminum | 5.0 | 4.8 | 4.0 | 4.5 | 4.4 | 4.2 |
| Maintenance rate (%) of tensile shear adhesion strength to aluminum after high-temperature high-humidity test | 96 | 92 | 92 | 93 | 27 | 25 |
| Tensile shear adhesion strength (MPa) to copper | 8.0 | 7.7 | 6.9 | 7.5 | 4.9 | 7.0 |
| Maintenance rate (%) of tensile shear adhesion strength to copper after high-temperature high-humidity test | 99 | 100 | 98 | 99 | 65 | 54 |
| Relative dielectric constant (1 GHz) | 2.6 | 2.6 | 2.6 | 2.6 | 2.8 | 2.9 |
| Dielectric loss tangent (1 GHz) | 0.005 | 0.006 | 0.006 | 0.005 | 0.010 | 0.010 |
| Glass transition temperature (° C.) | 162 | 160 | 160 | 161 | 162 | 159 |
| Cracks after heat resistance test | None | None | None | None | Observed | Observed |

(2)

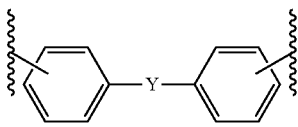

wherein Y is a bond, a $C_{1-6}$ alkylene group, an oxygen atom (—O—), or a group represented by the formula: —S(O)$_m$— wherein m is 0, 1, or 2;

$R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

$R^2$ is the same or different, and is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom; and n is the same or different, and is an integer of 0 to 3, and wherein the curing accelerator is a tertiary amine compound or an imidazole compound.

2. The method according to claim 1, wherein the curing accelerator is an imidazole compound.

3. The method according to claim 1, wherein the curing accelerator is a tertiary amine compound.

4. The method according to claim 1, wherein the epoxy resin is represented by the formula (1a):

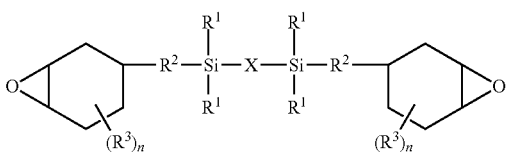

(1a)

wherein X is a divalent group obtained by removing two hydrogen atoms from a hydrocarbon ring, or a divalent group represented by the formula (2a):

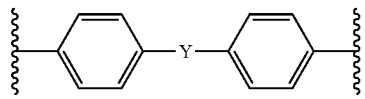

(2a)

wherein Y is a bond, a $C_{1-6}$ alkylene group, an oxygen atom (—O—), or a group represented by the formula: —S(O)$_m$— wherein m is 0, 1, or 2;

$R^1$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom;

$R^2$ is the same or different, and is a $C_{1-18}$ alkylene group, wherein one or more carbon atoms of this group other than a carbon atom directly bonded to a silicon atom may be replaced by at least one atom selected from the group consisting of an oxygen atom and a nitrogen atom;

$R^3$ is the same or different, and is a $C_{1-18}$ alkyl group, a $C_{2-9}$ alkenyl group, a cycloalkyl group, an aryl group, or an aralkyl group, wherein one or more carbon atoms of these groups may be replaced by at least one atom selected from the group consisting of an oxygen atom and a nitrogen atom; and n is the same or different, and is an integer of 0 to 3.

5. The method according to claim 1, wherein the epoxy resin is represented by the formula (1a):

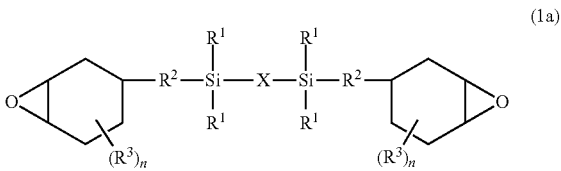

(1a)

wherein all $R^1$ are $C_{1-3}$ alkyl groups, both n are 0, both $R^2$ are dimethylene groups, and X is a 1,4-phenylene group.

6. The method according to claim 1, wherein the acid anhydride-based curing agent is at least one member selected from the group consisting of cyclic aliphatic acid anhydrides, aromatic acid anhydrides, and aliphatic acid anhydrides.

7. The method according to claim 1, wherein the acid anhydride-based curing agent is at least one member selected from the group consisting of hexahydrophthalic anhydride, 3-methylhexahydrophthalic anhydride, 4-methylhexahydrophthalic anhydride, 1-methylnorbornane-2,3-dicarboxylic anhydride, 5-methylnorbornane-2,3-di carboxylic anhydride, norbornane-2,3-dicarboxylic anhydride, 1-methylnadic anhydride, 5-methylnadic anhydride, nadic anhydride, phthalic anhydride, tetrahydrophthalic anhydride, 3-methyltetrahydrophthalic anhydride, 4-methyltetrahydrophthalic anhydride, and dodecenylsuccinic anhydride.

8. The method according to claim 1, wherein the metal is copper or aluminum.

* * * * *